(12) United States Patent
Miyagi et al.

(10) Patent No.: US 10,042,262 B2
(45) Date of Patent: Aug. 7, 2018

(54) NEGATIVE DEVELOPING METHOD AND NEGATIVE DEVELOPING APPARATUS

(71) Applicant: SCREEN Holdings Co., Ltd., Kyoto (JP)

(72) Inventors: Tadashi Miyagi, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/071,601

(22) Filed: Mar. 16, 2016

(65) Prior Publication Data

US 2016/0282722 A1    Sep. 29, 2016

(30) Foreign Application Priority Data

Mar. 23, 2015  (JP) ................................. 2015-059547

(51) Int. Cl.
| | | |
|---|---|---|
| *G03C 5/26* | (2006.01) | |
| *G03F 7/32* | (2006.01) | |
| *G03F 7/40* | (2006.01) | |
| *G03F 7/30* | (2006.01) | |

(52) U.S. Cl.
CPC ............ *G03F 7/325* (2013.01); *G03F 7/3021* (2013.01); *G03F 7/3057* (2013.01); *G03F 7/40* (2013.01)

(58) Field of Classification Search
USPC ........................................................ 430/434
See application file for complete search history.

(56) References Cited

U.S. PATENT DOCUMENTS

| | | | |
|---|---|---|---|
| 5,658,615 A | 8/1997 | Hasebe et al. ................. 427/240 |
| 5,897,982 A * | 4/1999 | Shibata ................. G03F 7/3021 |
| | | | 430/311 |
| 2007/0264007 A1* | 11/2007 | Kitahara ............... G03F 7/3021 |
| | | | 396/518 |
| 2014/0199638 A1 | 7/2014 | Miyagi et al. ................ 430/432 |

FOREIGN PATENT DOCUMENTS

| | | |
|---|---|---|
| JP | H07-320999 A | 12/1995 |
| JP | 3869326 B2 | 10/2006 |
| JP | 2011-028281 | 2/2011 |
| JP | 2014-135440 | 7/2014 |

OTHER PUBLICATIONS

Office Action dated Dec. 2, 2016 in corresponding Korean Patent Application No. 10-2016-0034045.

* cited by examiner

*Primary Examiner* — Daborah Chacko-Davis
(74) *Attorney, Agent, or Firm* — Ostrolenk Faber LLP (57) ABSTRACT

Disclosed is a negative developing method including a puddle-forming step, a diluting step, and a surface drying step. In the puddle-forming step, developer containing an organic solvent is supplied to a resist film formed on a surface of the substrate and keeping a puddle of the developer on the resist film. In the diluting step, a concentration of a dissolution product dissolved in the developer on the resist film is diluted by additionally supplying the developer containing the organic solvent to the resist film after the puddle-forming step. In the surface drying step, the surface of the substrate is dried by rotating the substrate after the diluting step.

18 Claims, 4 Drawing Sheets

NEGATIVE DEVELOPING METHOD AND NEGATIVE DEVELOPING APPARATUS

CROSS-REFERENCE TO RELATED APPLICATIONS

This application claims priority to Japanese Patent Application No. 2015-059547 filed Mar. 23, 2015, the disclosure of which is hereby incorporated herein by reference in its entirety for all purposes.

BACKGROUND OF THE INVENTION

1. Field of the Invention

The present invention relates to a negative developing method and a negative developing apparatus for performing development to a semiconductor substrate, a glass substrate for photomask, a glass substrate for liquid crystal display, an optical disk substrate, and the like (hereinafter, simply referred to as a "substrate") using developer containing an organic solvent.

2. Description of the Related Art

In recent years, instead of a positive developing method (also called positive tone development), a negative developing method (also called negative tone development or negative development) has been adopted. In the negative developing method, a non-exposed part of a resist film is dissolved. The negative developing method uses developer that contains an organic solvent such as butyl acetate, and a cleaning liquid that contains an organic solvent such as MIBC (Methyl Iso Butyl Carbinol). This is disclosed, for example, in page 79 of Japanese Unexamined Patent Publication No. 2011-28281A. The cleaning liquid used for the negative developing method is more expensive than the cleaning liquid (e.g., deionized water) used for the positive developing method.

Accordingly, Japanese Unexamined Patent Publication No. 2014-135440A has suggested the following. That is, a surface drying step for drying a surface of a substrate is performed after a developing step while a substrate is rotated without a cleaning liquid. Such a method allows reduction in amount of usage of the cleaning liquid.

However, the example of the currently-used apparatus with such a configuration has the following drawback. A line and space pattern has a larger non-exposed part than a hole pattern, leading to a more amount of dissolution product upon forming the line and space pattern. In the developing step, the developer with a more amount of dissolution product causes the dissolution product to adhere to the resist film again even through the surface drying step. This may cause development defect such as bridge defect. In this specification, the term "dissolution product" is collectively used for a dissolved resist film in the developer, and a residue or foreign substances that cause the development defect.

SUMMARY OF THE INVENTION

The present invention has been made regarding the state of the art noted above, and its one object is to provide a negative developing method and a negative developing apparatus that allow development with high quality.

The present invention is constituted as stated below to achieve the above object. A first aspect of the present invention provides a negative developing method for performing negative development to a substrate. The negative developing method includes a puddle-forming step of supplying developer containing an organic solvent to a resist film formed on a surface of the substrate and keeping a puddle of the developer on the resist film; a diluting step of diluting a concentration of a dissolution product dissolved in the developer on the resist film by additionally supplying the developer containing the organic solvent to the resist film after the puddle-forming step; and a surface drying step of drying the surface of the substrate by rotating the substrate after the diluting step.

In the puddle-forming step, the puddle of the developer on the resist film dissolves the non-exposed part of the resist film. This generates the dissolution product, which disperses in the developer on the resist film. In the diluting step, the developer is supplied onto the resist film in addition to the developer supplied in the puddle-forming step. This causes reduction in concentration of the dissolution product in the developer on the resist film. Here, the concentration of the dissolution product corresponds to a concentration of the dissolution product in the developer (more specifically, a ratio of the dissolution product in the developer on the resist film relative to the developer on the resist film). In the surface drying step, the substrate is rotated so as for a centrifugal force to act on the developer of the resist film, whereby the developer is removed from the resist film. As noted above, the diluting step is performed prior to the surface drying step. Accordingly, the surface drying step allows suitable removal of the dissolution product from the resist film together with the developer, leading to suitable prevention of re-adhesion of the dissolution product to the resist film. As a result, this suitably suppresses generation of the development defect such as bridge defect, causing development with high-quality.

It is preferred that the substrate rotates in the diluting step according to the first aspect of the present invention. This allows effective removal of the dissolution product in the developer on the resist film from the substrate together with the developer. As a result, effective dilution of the developer on the resist film is obtainable.

It is preferred that the substrate is started to rotate simultaneously with start of supplying the developer in the diluting step according to the first aspect of the present invention. This allows more efficient removal of the dissolution product from the resist film together with the developer.

It is preferred that the developer containing the organic solvent is successively supplied in the diluting step according to the first aspect of the present invention. This allows rapid dilution of the concentration of the dissolution product in the developer on the resist film.

It is preferred that the developer containing the organic solvent is intermittently supplied in the diluting step according to the first aspect of the present invention. This allows stepwise dilution of the concentration of the dissolution product in the developer on the resist film.

It is preferred that the developer containing the organic solvent is supplied to the center of the substrate in the diluting step according to the first aspect of the present invention. This allows effective dilution of the concentration of the dissolution product in the developer on the resist film.

It is preferred that a nozzle for supplying the developer containing the organic solvent in the diluting step is equal to a nozzle having used for supplying the developer containing the organic solvent in the puddle-forming step. The puddle-forming step uses the same nozzle as that used in the diluting step. This causes ease performance of the diluting step. Moreover, in the diluting step, the developer same as the developer accumulated on the resist film is used for diluting the concentration of the dissolution product.

It is preferred in the surface drying step according to the first aspect of the present invention that the substrate rotates while no cleaning liquid is supplied to the substrate for removing off the developer on the resist film by a centrifugal force. This leads to no use of the cleaning liquid for cleaning the surface of the substrate, causing reduction in amount of usage of the cleaning liquid. In addition, rotating the substrate causes the developer to be removed off the resist film together with the dissolution product. This allows stop of the development of the resist film at an appropriate timing.

It is preferred that the negative developing method according to the first aspect of the present invention further includes a backside cleaning step of cleaning a backside of the substrate by supplying a cleaning liquid only to the backside of the substrate while rotating the substrate after the surface drying step; and a backside drying step of drying the backside of the substrate while rotating the substrate after the backside cleaning step. The negative developing method includes the backside cleaning step, thereby allowing suitable cleaning of the backside of the substrate. In addition, the negative developing method includes the backside drying step, thereby allowing suitable drying of the backside of the substrate.

A second aspect of the present invention provides a negative developing apparatus for performing negative development to a substrate. The negative developing apparatus includes a substrate holder that holds a substrate substantially horizontally; a rotating drive unit that rotates the substrate holder around a substantially vertical axis; a developer supplying unit that supplies developer containing an organic solvent to a surface of the substrate held with the substrate holder; and a controller that controls the rotating drive unit and the developer supplying unit. The controller causes the developer supplying unit to supply the developer to a resist film formed on the surface of the substrate for forming a liquid layer of the developer on the resist film, causes the developer supplying unit to supply the developer to the resist film again for diluting a concentration of a dissolution product dissolved into the liquid layer of the developer on the resist film after the liquid layer of the developer remains on the resist film for a given period of time, and causes the rotating drive unit to rotate the substrate for drying the surface of the substrate.

The developer supplying unit supplies the developer to the substrate for forming the liquid layer of the developer on the resist film on the surface of the substrate. A condition in which the liquid layer of the developer is formed on the resist film remains for a given period of time. The liquid layer of the developer on the resist film dissolves a non-exposed part of the resist film. This generates the dissolution product, which disperses in the liquid layer of the developer on the resist film. Thereafter, the developer supplying unit supplies the developer again to the substrate for diluting the concentration of the dissolution product. Here, the concentration of the dissolution product corresponds to a concentration of the dissolution product in the developer (more specifically, a ratio of the dissolution product in the liquid layer of the developer on the resist film relative to the liquid layer of the developer on the resist film). Thereafter, the rotating drive unit rotates the substrate for removing the developer on the resist film. As noted above, the concentration of the dissolution product in the liquid layer of the developer on the resist film is diluted before the developer on the resist film is removed. Accordingly, rotating the substrate by the rotating drive unit allows suitable removal of the dissolution product from the resist film together with the developer, leading to suitable prevention of re-adhesion of the dissolution product to the resist film. As a result, this suppresses generation of the development defect such as bridge defect suitably, leading to maintained quality of the development suitably.

It is preferred in the second aspect of the present invention that the controller causes the substrate to rotate when the concentration of the dissolution product is diluted. This allows effective discharge of the dissolution product in the developer on the resist film from the substrate together with the developer. As a result, effective dilution of the developer on the resist film is obtainable.

It is preferred in the second aspect of the present invention that the controller causes simultaneous start of supply of the developer and rotating of the substrate when the concentration of the dissolution product is diluted. This allows more efficient discharge of the dissolution product from the resist film together with the developer.

It is preferred in the second aspect of the present invention that the controller causes successive supply of the developer containing the organic solvent when the concentration of the dissolution product is diluted. This allows rapid dilution of the concentration of the dissolution product in the developer on the resist film.

It is preferred in the second aspect of the present invention that the controller causes intermittent supply of the developer containing the organic solvent when the concentration of the dissolution product is diluted. This allows stepwise dilution of the developer on the resist film.

It is preferred in the second aspect of the present invention that the controller causes supply of the developer containing the organic solvent to the center of the substrate when the concentration of the dissolution product is diluted. This allows effective reduction in concentration of the dissolution product in the developer on the resist film.

It is preferred in the second aspect of the present invention that the controller causes the substrate to rotate without supplying any cleaning liquid to the substrate for removing off the developer on the resist film by a centrifugal force when the surface of the substrate is dried. This leads to no use of a cleaning liquid for cleaning the surface of the substrate, causing reduction in amount of usage of the cleaning liquid. In addition, rotating the substrate causes the developer to be removed off from the resist film together with the dissolution product. This allows stop of the development of the resist film at an appropriate timing.

The negative developing apparatus according to the second aspect of the present invention further includes a cleaning liquid supplying unit that supplies a cleaning liquid to a backside of the substrate held with the substrate holder. The controller causes the cleaning liquid supplying unit to supply the cleaning liquid only to the backside of the substrate and causes the rotating drive unit to rotate the substrate after the surface of the substrate is cleaned, whereby the backside of the substrate is cleaned, and after the backside of the substrate is cleaned, the controller causes the rotating drive unit to rotate the substrate for drying the backside of the substrate. Such is preferable. The negative developing apparatus includes the cleaning liquid supplying unit, thereby obtaining suitable cleaning of the backside of the substrate. In addition, the controller performs control to clean and dry the backside of the substrate suitably.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
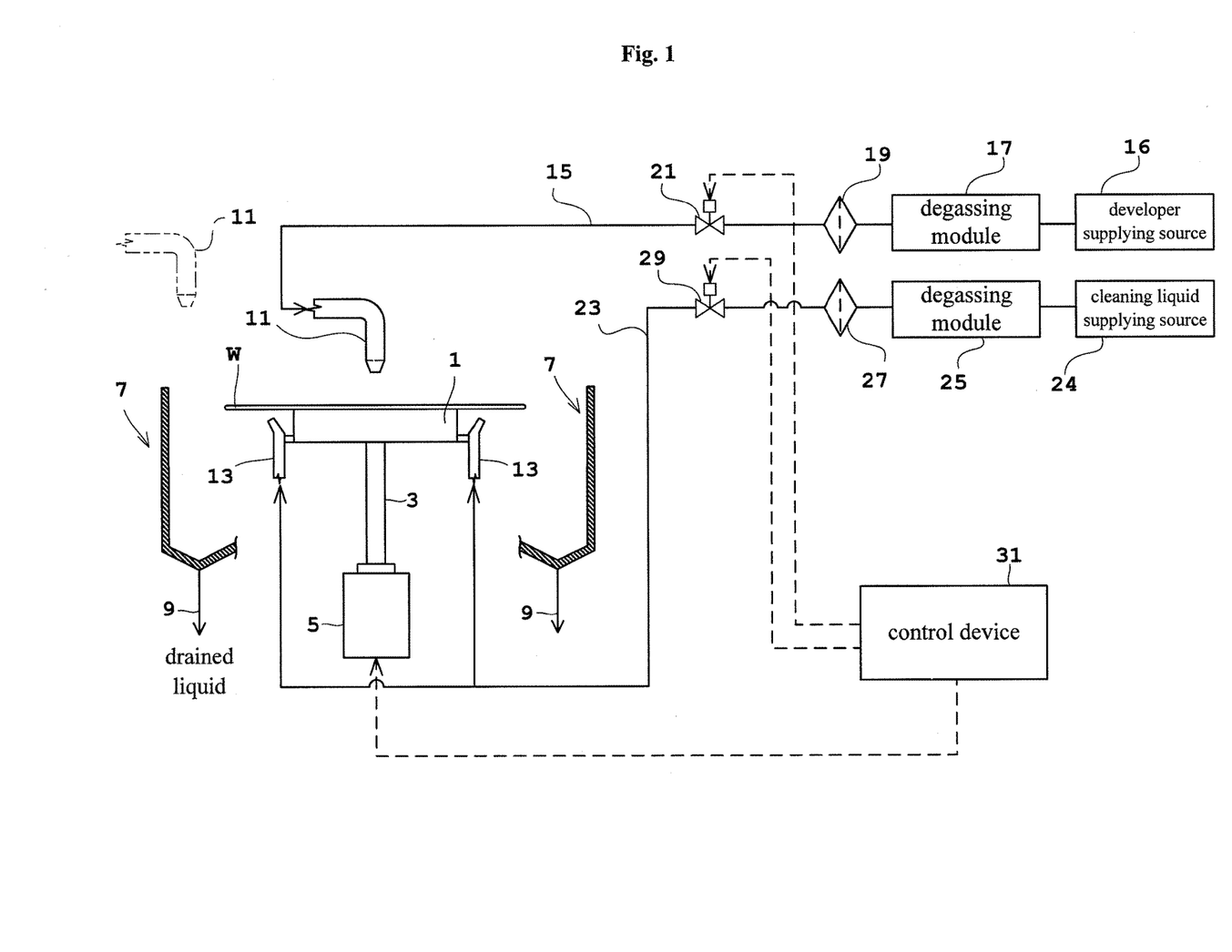
FIG. 1 is a schematic longitudinal sectional view of a negative developing apparatus according to one embodiment of the present invention.

The following describes one non-limiting embodiment of the present invention with reference to drawings. FIG. 1 is a schematic longitudinal sectional view of a negative developing apparatus according to one embodiment of the present invention.

A negative developing apparatus includes a spin chuck 1 that holds a substrate (e.g., a semiconductor wafer) W substantially horizontally. The spin chuck 1 suction-holds a backside (undersurface) of the substrate W, for example. The spin chuck 1 includes a lower part connected to a rotary shaft 3. A spin motor 5 is disposed on a lower part of the rotary shaft 3. The spin motor 5 spins the spin chuck 1 and the rotary shaft 3 about a substantially vertical axis. As a result, the substrate W is rotated around the substantially vertical axis passing the center of the substrate W. A scatter preventive cup 7 is disposed around the spin chuck 1. Here, the spin chuck 1 corresponds to the substrate holder in the present invention. The spin motor 5 corresponds to the rotating drive unit in the present invention.

A drain tube 9 is in fluid communication with a bottom of the scatter preventive cup 7. A developer supplying nozzle 11 is disposed adjacent to the scatter preventive cup 7. The developer supplying nozzle 11 supplies developer to a surface of the substrate W. The developer supplying nozzle 11 is, for example, a straight nozzle having an outlet formed on a tip end thereof. The developer supplying nozzle 11 moves between a supply position (by solid lines in the drawing) over the spin chuck 1 and a retracting position (by chain double-dashed lines in the drawing) away from the above of the scatter preventive cup 7. When the developer supplying nozzle 11 is moved to the supply position, the outlet of the developer supplying nozzle 11 is located immediately above the center of the substrate W. The developer supplying nozzle 11 corresponds to the "developer supplying unit" and the "nozzle" in the present invention.

A cleaning liquid supplying nozzle 13 is disposed inside the scatter preventive cup 7 and around a lower portion of the spin chuck 1. The cleaning liquid supplying nozzle 13 supplies a cleaning liquid to the backside of the substrate W. The cleaning liquid supplying nozzle 13 is, for example, a straight nozzle having an outlet at a tip end thereof. The cleaning liquid supplying nozzle 13 corresponds to the cleaning liquid supplying unit in the present invention.

The developer supplying nozzle 11 is in fluid communication with a developer supplying source 16 via a developer supplying pipe 15 into which a degassing module 17, a filter 19, and a switch control valve 21 are inserted. The developer supplying source 16 stores the developer containing an organic solvent. The developer is fed to the developer supplying nozzle 11 with pressure of inactive gas. Examples of the organic solvent in the developer include butyl acetate. The degassing module 17 degasses the developer. The developer through the developer supplying nozzle 11 is supplied and stopped in accordance with switching on and off of the switch control valve 21.

The cleaning liquid supplying nozzle 13 is in fluid communication with a cleaning liquid supplying source 24 via a cleaning liquid supplying pipe 23. A degassing module 25, a filter 27, and a switch control valve 29 are inserted into the cleaning liquid supplying pipe 23. The cleaning liquid supplying source 24 stores a cleaning liquid containing an organic solvent. The cleaning liquid is fed to the cleaning liquid supplying nozzle 13 with pressure of inactive gas. Examples of the organic solvent in the cleaning liquid include MIBC. The degassing module 25 degasses the cleaning liquid. The cleaning liquid through the cleaning liquid supplying nozzle 13 is supplied and stopped in accordance with switching on and off of the switch control valve 29.

The negative developing apparatus further includes a control device 31. The control device 31 controls en bloc spinning of the spin motor 5, movement of the developer supplying nozzle 11, feeding of the developer in the developer supplying source 16, driving of the degassing modules 17 and 25, switching on and off of the switch control valves 21 and 29, and feeding of the cleaning liquid in the cleaning liquid supplying source 24. More specifically, the control device 31 causes rotating of the substrate W at a given timing and a given rotation speed in accordance with processing recipes set in advance, and causes supply of the developer and the cleaning liquid at a given timing and a given flow rate. The control device 31 corresponds to the controller in the present invention.

Figure 2:
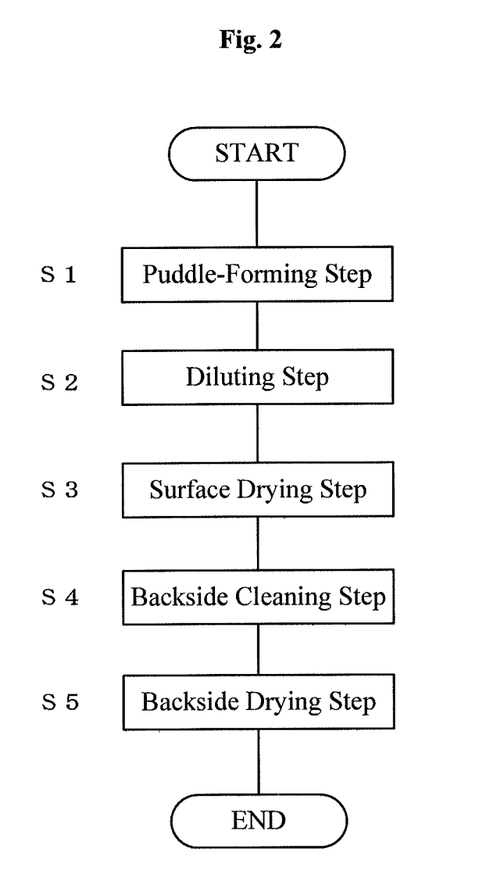
FIG. 2 is a flow chart of procedures of negative development.
Figure 3:
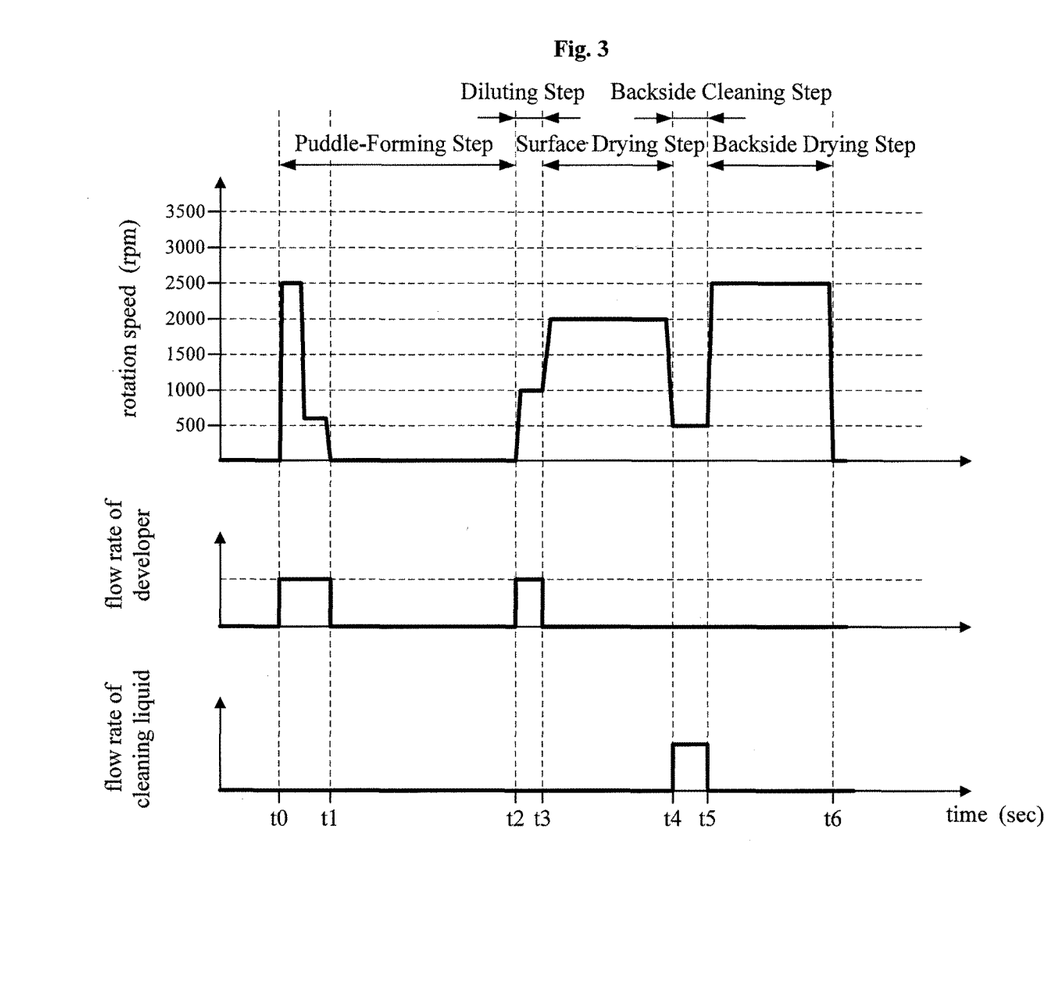
FIG. 3 is a graph illustrating a time variation in rotation speed of a substrate, flow rate of developer, and flow rate of a cleaning liquid according to the embodiment of the present invention.

The following describes operation of the negative developing apparatus with reference to FIGS. 2 and 3. FIG. 2 is a flow chart of procedures of negative development by the negative developing apparatus. FIG. 3 is a graph illustrating a time variation in rotation speed of the substrate, flow rate of the developer, and flow rate of the cleaning liquid according to the embodiment of the present invention. Hereunder, it is assumed that the substrate W is already held with the spin chuck 1, and the developer supplying nozzle 11 is moved to the supplying position. It is also assumed that the surface (top face) of the substrate W has an exposed resist film formed thereon.

<Step S1> Puddle-Forming Step (Times t0 to t2)

At a time t0, the control device 31 controls the spin motor 5, the developer supplying source 16, the degassing module 17, and the switch control valve 21 to rotate the substrate W at a given speed and to start supply of the developer containing the organic solvent from the developer supplying nozzle 11 to the center of the surface of the substrate W. The control device 31 continuously performs control so as to rotate the substrate W and supply the developer for a period from the time t0 to a time t1. The developer supplied to the substrate W spreads over the surface of the substrate W such that the resist film formed on the surface of the substrate W is covered with the developer. In other words, a liquid layer of the developer is formed on the resist film.

At the time t1, the control device 31 performs control so as to stop the supply of the developer onto the substrate W and to stop rotating of the substrate W. The developer supplying nozzle 11 is on standby in the supplying position without moving after stopping the supply of the developer. The developer is accumulated in a puddle on the surface of the substrate W (i.e., on the resist film) in the horizontal attitude. Such a condition, i.e., a condition in which the developer is accumulated on the resist film is maintained for a period from the time t1 to a time t2. In other words, a condition in which the liquid layer of the developer is formed on the resist film is maintained for a period from the time t1 to the time t2. The development proceeds with the developer on the resist film. That is, the developer dissolves a non-exposed part of the resist film. The dissolved non-exposed part becomes a dissolution product containing in the developer. Such a puddle-forming step is completed at the time t2.

An entire period of the puddle-forming step (i.e., a period from the time t0 to the time t2) is, for example, 30 seconds. The period of the puddle-forming step includes a period of 5 seconds (a period from the time t0 to the time t1), for example, for supplying the developer to the resist film. The period of the puddle-forming step includes a period of 25 seconds (a period from the time t1 to the t2), for example, for maintaining the developer formed on the resist film in a puddle. In the former period, a flow rate of the developer ranges from 60 to 150 mL/min, a supply amount of the developer ranges from 9 to 12 cc, and a rotation speed of the substrate W is 2500 rpm, for example. In the latter period, a supply amount of the developer is 0 cc, and a rotation speed of the substrate W is 0 rpm, for example.

<Step S2> Diluting Step (From Time t2 to t3)

The diluting step starts simultaneously with completion of the puddle-forming step. That is, at the time t2, the control device 31 causes the developer supplying nozzle 11 to supply the developer containing the organic solvent again to the center of the surface of the substrate W, and causes the substrate W to rotate again. When the developer is supplied to the resist film, the developer accumulated in the puddle-forming step remains on the resist film. The developer dropped in the diluting step dilutes a concentration of the dissolution product. Here, the concentration of the dissolution product corresponds to a concentration of the dissolution product in the developer (more specifically, a ratio of the dissolution product in the developer on the resist film relative to the developer on the resist film). This allows a lowered concentration of the dissolution product in the developer. At this time, the substrate W is rotating. Accordingly, an area in which the concentration of the dissolution product in the developer dilutes spreads rapidly from the center to a periphery edge of the substrate W. Such a diluting step is completed at a time t3.

Here, a period of the diluting step (a period from the time t2 to the time t3) is, for example, 2 seconds. The developer supplying nozzle 11 successively supplies the developer over the period of the diluting step. A flow rate of the developer in the diluting step is substantially equal to that in the puddle-forming step, for example (specifically, 60 to 150 mL/min). A supply amount of the developer in the diluting step is, for example, 2 cc. In addition, in the diluting step, the substrate W starts rotating simultaneously with start of the supply of the developer. In the diluting step, a rotation speed of the substrate W is, for example, 1000 rpm.

<Step S3> Surface Drying Step (Time t3 to t4)

The surface drying step starts simultaneously with completion of the diluting step. That is, the control device 31 controls the rotation speed of the substrate W at the time t3. Here in the surface drying step, no cleaning liquid is supplied to the substrate W (resist film). Since the rotation speed of the substrate W is relatively high, a relatively large centrifugal force acts on the developer on the resist film (the developer including the developer accumulated on the resist film in the puddle-forming step and the developer added in the diluting step). The developer on the resist film is removed off by a centrifugal force, thereby dispersing out of the substrate W. Consequently, the developer is rapidly removed from the resist film. This stops development of the resist film with the developer. The developer contains the organic solvent, and the concentration of the dissolution product in the developer is already diluted in the diluting step. Accordingly, when the developer is removed from the resist film, the dissolution product is also removed smoothly from the substrate W. Then, the surface of the substrate W is dried rapidly. Such a surface drying step is completed at a time t4.

A period of the surface drying step (a period from the time t3 to the time t4) is, for example, 10 seconds. The spin motor 5 rotates the substrate W over the period of the surface drying step. The rotation speed of the substrate W in the surface drying step is, for example, 2000 rpm.

<Step S4> Backside Cleaning Step (Time t4 to t5)

The backside cleaning step starts simultaneously with completion of the surface drying step. Specifically, at the time t4, the control device 31 performs control so as to decrease the rotation speed of the substrate W. Immediately after the rotation speed of the substrate W is decreased, the control device 31 causes the cleaning liquid supply nozzle 13 to starts supply of the cleaning liquid to the backside of the substrate W. Since the rotation speed of the substrate W is relatively low, the cleaning liquid supplied to the backside of the substrate W suitably spreads only on the backside of the substrate W without dispersing therearound. Accordingly, the cleaning liquid allows removal of impurities such as dust on the backside of the substrate W while an atmosphere above the surface of the substrate W is kept clean. At a time t5, the control device 31 stops the supply of the cleaning liquid, and thus stops the backside cleaning step.

A period of the backside cleaning step (a period from the time t4 to the time t5) is, for example 5 seconds. The cleaning liquid supplying nozzle 13 supplies the cleaning liquid successively throughout the period of the backside cleaning step. Moreover, the spin motor 5 rotates the substrate W throughout the period of the backside cleaning step. The rotation speed of the substrate W in the backside cleaning step is, for example, 500 rpm.

<Step S5> Backside Drying Step (Time t5 to t6)

The backside drying step starts simultaneously with completion of the backside cleaning step. That is, at the time t5, the control device 31 increases the rotation speed of the substrate W. Since the substrate W rotates at a relatively high rotation speed, the backside of the substrate W is dried rapidly through a spin-dry effect. At a time t6, the control device 31 stops rotating of the substrate W, and thus completes the backside drying step.

A period of the backside drying step (a period from the time t5 to a time t6) is, for example, 10 seconds. The spin motor 5 rotates the substrate W throughout the period of the backside drying step. The rotation speed of the substrate W in the backside drying step is, for example, 2500 rpm.

As noted above, with the negative developing apparatus and the negative developing method according to the embodiment of the present embodiment, the diluting step is performed before the surface drying step. In the diluting step, the developer is further added to the developer accumulated on the resist film, leading to reduction in concentration of the dissolution product in the developer on the resist film. This allows ready removal of the dissolution product in the developer from the resist film together with the developer in the surface drying step. That is, this suitably prevents re-adhesion of the dissolution product to the resist film. As a result, this suppresses generation of the development defect such as bridge defect suitably, causing development with high quality.

The processing liquid used in the diluting step is equal to the processing liquid used in the puddle-forming step (i.e., the developer). Consequently, the diluting step has no need to supply a rinse liquid, for example, to the surface of the substrate W. The negative developing apparatus has no need to provide any rinse liquid supply system for supplying the rinse liquid to the surface of the substrate W. As a result, the present embodiment allows reduction in development defect, such as bridge defect, with low costs.

The developer is successively supplied in the diluting step. This allows a short-time dilution of the concentration of the dissolution product in the developer on the resist film.

The developer is supplied to the center of the substrate W in the diluting step. This allows efficient dilution of the concentration of the dissolution product in the developer on the resist film.

In the diluting step, the substrate W rotates, whereby an area in which the developer is dilutes spreads rapidly from the center to the periphery edge of the substrate W. Accordingly, this allows uniform dilution of the concentration of the dissolution product in the entire developer on the resist film. Especially, in the diluting step, the substrate W starts rotating simultaneously with start of supplying the developer. This allows more efficient dilution of the concentration of the dissolution product in the developer on the resist film. Moreover, the rotation speed of the substrate W in the diluting step is lower than the rotation speed of the substrate W when the developer is supplied to the resist film in the puddle-forming step. Moreover, the rotation speed of the substrate W in the diluting step is lower than the rotation speed of the substrate W in the surface drying step and the backside drying step. As noted above, the rotation speed of the substrate W in the diluting step is relatively low, leading to accurate dilution of the concentration of the dissolution product in the developer on the resist film.

The period of the diluting step is shorter than the period of the puddle-forming step. Moreover, the period of the diluting step is shorter than the period in which the developer is supplied to the resist film in the puddle-forming step. As noted above, the period of the diluting step is relatively short, achieving suppression in progress of the development with the developer dropped in the diluting step. In other words, the developer dropped in the diluting step possibly prevents influence on the development by the developer on the resist film in the puddle-forming step.

The diluting step uses the developer supplying nozzle 11 that has supplied the developer in the puddle-forming step, leading to performance thereof with ease. In the present embodiment, after supplying the developer in the puddle-forming step, the developer supplying nozzle 11 does not move in a stand-by state above the substrate W until the diluting step starts. Consequently, the developer supplying nozzle 11 allows supply of the developer immediately after the diluting step starts. That is, the diluting step is performable simultaneously with completion of the puddle-forming step. As a result, a developing time (e.g., a period from the time t0 to the time t3) is controllable accurately. In addition, reduction in time for a series of development from the puddle-forming step to the backside drying step is obtainable, leading to enhanced throughput of the negative developing apparatus.

In the diluting step, the developer similar to the developer in the puddle-forming step is used. This allows suitable dilution of the concentration of the dissolution product in the developer on the resist film.

In the diluting step, the developer containing the organic solvent is supplied. Consequently, in the surface drying step, the dissolution product in the developer is removal from the resist film smoothly together with the developer.

In the surface drying step, the substrate W is rotated without supplying any cleaning liquid. Consequently, the developer on the resist film is removal off by a centrifugal force. As noted above, no cleaning liquid is used for removing the developer on the resist film, leading to efficient reduction in amount of usage of the cleaning liquid.

The rotation speed of the substrate W in the surface drying step is relatively high. For instance, the rotation speed of the substrate W in the surface drying step is higher than the rotation speed of the substrate W in the diluting step and the backside cleaning step. Accordingly, this achieves rapid removal of the developer from the resist film, and thus achieves stop of the development of the resist film at an appropriate timing. Consequently, controlling a timing of starting the surface drying step allows accurate control of a developing time. That is, line widths of circuit patterns are controllable with high accuracy.

Moreover, in the surface drying step, removal of the developer (i.e., stop of the development), removal of the dissolution product (i.e., suppression of the development defect), and drying of the surface of the substrate W are performed at once. This allows reduction in time for a series of processes in the negative developing method.

Moreover, in the backside cleaning step, the backside of the substrate W is cleaned with the cleaning liquid, leading to suitable cleaning of the backside of the substrate W. Since the cleaning liquid is supplied to only the backside of the substrate W, efficient reduction in amount of usage of the cleaning liquid is obtainable. Moreover, since the cleaning liquid contains the organic solvent, suitable cleaning is performable to the substrate W subjected to the negative development.

Moreover, the rotation speed of the substrate W in the backside cleaning step is relatively low. For instance, the rotation speed of the substrate W in the backside cleaning step is lower than the rotation speed of the substrate W in the surface drying step, the diluting step, and the backside drying step. This leads to difficulty in generation of any splash or mist of the cleaning liquid. Even if splash or mist of the cleaning liquid is generated, the splash or the mist of the cleaning liquid is unlikely to rise around since the substrate W rotates at a relatively low rotation speed. This allows an atmosphere above the surface of the substrate W to be kept clean. As a result, the splash, the mist and the dust can be prevented from adhere again to the surface of the dried substrate W, leading to avoidance of reduction in quality of processing the substrate W.

The rotation speed of the substrate W in the backside drying step is relatively high. For instance, the rotation speed of the substrate W in the backside drying step is higher than the rotation speed of the substrate W in the diluting step, the surface drying step, and the backside cleaning step. Accordingly, the backside of the substrate W can be dried rapidly, allowing more reduction in time for a series of processes for the negative development.

The present invention is not limited to the foregoing examples, but may be modified as follows.

(1) In the embodiment mentioned above, the rotation speed of the substrate W in the diluting step is, for example, 1000 rpm. However, this is not limitative. For instance, the rotation speed of the substrate W in the diluting step is preferably 2500 rpm or less. For instance, the rotation speed of the substrate W in the diluting step may be equal to or higher than the rotation speed of the substrate W in the surface drying step. For instance, the rotation speed of the substrate W in the diluting step may be equal to or higher than the rotation speed of the substrate W for the period (e.g., from the time t0 to the time t1) in which the developer is supplied to the resist film in the puddle-forming step. The rotation speed of the substrate W in the diluting step is set relatively high. This allows more rapid dilution of the concentration of the dissolution product in the developer which was laid on the resist film in the puddle-forming step. Moreover, even if the developer adheres to the backside of the substrate W in the diluting step, the developer on the backside of the substrate W is removable in the backside cleaning step and the backside drying step after the diluting step. Consequently, even a high rotation speed of the substrate W in the diluting step allows suitable maintenance of development quality.

Moreover, the rotation speed of the substrate W in the diluting step is preferably 500 rpm or more. For instance, in the diluting step, the rotation speed of the substrate W may be equal to or higher than the rotation speed of the substrate W in the backside cleaning step. This allows reliable dilution of the concentration of the dissolution product in the developer which was accumulated on the resist film in the puddle-forming step.

(2) In the embodiment mentioned above, a flow rate of the developer in the diluting step is constant. However, this is not limitative. For instance, in the diluting step, the developer may be supplied while a flow rate thereof varies. Similarly, a flow rate of the developer in the puddle-forming step is constant. However, this is not limitative. For instance, the developer may be supplied in the puddle-forming step while a flow rate of the developer varies.

(3) In the embodiment mentioned above, the developer is continuously supplied throughout the diluting step. However, this is not limitative. For instance, the supply of the developer may be stopped partially during the diluting step. Similarly, in the embodiment mentioned above, the substrate W rotates throughout the diluting step. However, this is not limitative. For instance, rotating of the substrate W may be stopped partially during the diluting step. Moreover, in the diluting step, the supply of the developer may be stopped temporarily and the rotating of the substrate W may be stopped temporarily. In this case, a period of stopping the supply of the developer may be conform to, may overlap, or may not overlap a period of stopping the rotating of the substrate W.

Figure 4:
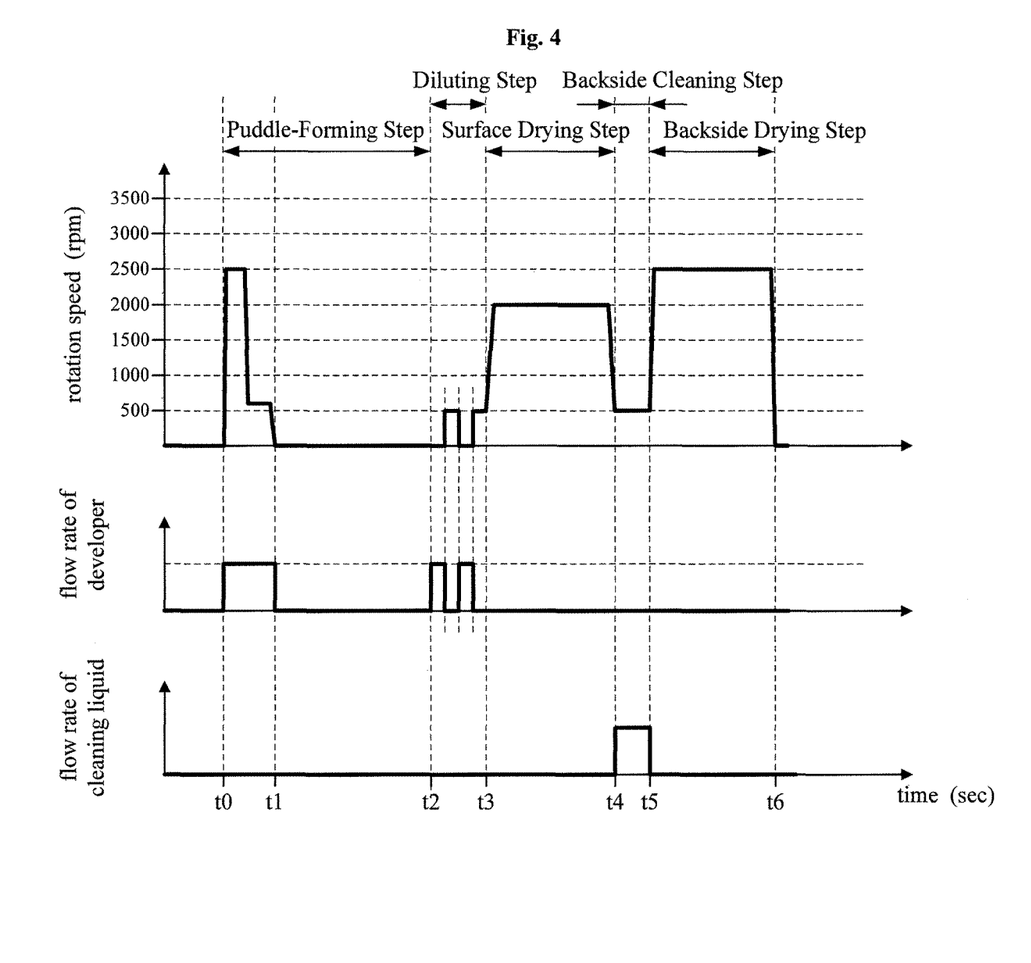
FIG. 4 is a graph illustrating a time variation in rotation speed of a substrate, flow rate of developer, and flow rate of a cleaning liquid according to one modification of the present invention.

FIG. 4 is a graph illustrating a time variation in rotation speed of a substrate, flow rate of developer, and flow rate of a cleaning liquid according to one modification of the present invention. As illustrated, the developer may be supplied intermittently in the diluting step. This allows stepwise dilution of the concentration of the dissolution product in the developer on the resist film. Moreover, this allows avoidance of drying the developer on the resist film.

Moreover, as illustrated in FIG. 4, a rotation speed of the substrate W for a period of supplying the developer in the diluting step differs from a rotation speed of the substrate W for a period of stopping the supply of the developer in the diluting step. For instance, the substrate W does not rotate during the supply of the developer. This allows more smooth supply of the developer on the resist film (substrate W). In addition, the substrate W rotates while the supply of the developer stops. This allows more appropriate stirring of the developer on the resist film. As noted above, controlling the rotation speed of the substrate W in accordance with a developer supplying timing allows more efficient reduction in concentration of the dissolution product in the developer.

In the present modification, the developer supplying timing or a number of rotations of the substrate W in the diluting step may be varied or adjusted appropriately.

(4) In the embodiments mentioned above, the substrate W starts rotating simultaneously with start of the supply of the developer in the diluting step. However, this is not limitative. For instance, the substrate W may start rotating after start of the supply of the developer.

(5) In the embodiments mentioned above, the rotation speed of the substrate W is constant in the diluting step. However, this is not limitative. For instance, in the diluting step, the substrate W may rotate while the rotation speed of the substrate W varies.

(6) In the embodiments mentioned above, the developer supplying nozzle 11 supplies the developer while remaining at rest in the supply position in the diluting step. However, this is not limitative. For instance, in the diluting step, the developer supplying nozzle 11 may supply the developer while moving.

(7) In the embodiments mentioned above, the same developer supplying nozzle 11 is used in the puddle-forming step and the diluting step. However, this is not limitative. That is, a nozzle different from the developer supplying nozzle 11 used in the puddle-forming step may be used in the diluting step. This allows appropriate selection and adoption of the developer supplying nozzle suitable for the puddle-forming step and the developer supplying nozzle for the diluting step. For instance, a nozzle that allows efficient dilution of the concentration of the dissolution product in the developer on the resist film is selectable as the developer supplying nozzle for use in the diluting step. For instance, a nozzle that dispenses the developer at a flow rate lower than that for the developer supplying nozzle 11 in the embodiments may be used in the diluting step. For instance, a nozzle (e.g., a spray nozzle) that allows supply of the developer to an area larger than that with the developer supplying nozzle 11 in the embodiments may be used in the diluting step.

(8) In the embodiments mentioned above, the developer supplying nozzle 11 and the cleaning liquid supplying nozzle 13 are each a straight nozzle. However, this is not limitative. That is, a slit nozzle that includes a slit outlet on a lower end face thereof may be used.

(9) In the embodiments mentioned above, the substrate W starts rotating simultaneously with start of the supply of the developer in the puddle-forming step. However, this is not limitative. That is, the substrate W may start rotating at a different time from that at which the supply of the developer starts. For instance, the substrate W may start rotating before the time t0, and the supply of the developer may start at the timing t0. Alternatively, the supply of the developer may start at the time t0 and the substrate W may start rotating after the time to.

Moreover, in the embodiments mentioned above, the substrate W rotates for a period of the time t0 to the time t1 in the puddle-forming step. However, this is not limitative. For instance, in the puddle-forming step, the substrate W does not necessarily rotate. Specifically, the substrate W may be at rest for the period of the time t0 to the time t2.

(10) In the embodiments mentioned above, after the developer is supplied (i.e., after the time t1), the substrate W stops rotating in the puddle-forming step. However, this is not limitative. For instance, the substrate W may rotate at an appropriate low speed (e.g., 5 rpm) after the developer is supplied until the puddle-forming step completes (i.e., for the period of the time t1 to the time t2).

(11) In the embodiments mentioned above, the cleaning liquid supplying source 24 for supplying the cleaning liquid to the cleaning liquid supplying nozzle 13 is provided separately from the developer supplying source 16 for supplying the developer to the developer supplying nozzle 11. However, this is not limitative. The developer for the negative development contains the organic solvent. Accordingly, the developer may be used as a cleaning liquid for cleaning the backside of the substrate W. In this case, the developer may be used as the cleaning liquid.

Specifically, the cleaning liquid supplying nozzle 13 is connected to the developer supplying source 16 via the cleaning liquid supplying pipe 23. In the puddle-forming step and the diluting step, the switch control valve 21 is controlled. When the switch control valve 21 opens, the developer supplying source 16 feeds the developer to the developer supplying nozzle 11 and the developer supplying nozzle 11 supplies the developer onto the resist film (the surface of the substrate W). In the backside cleaning step, the switch control valve 29 is controlled. When the switch control valve 29 opens, the developer supplying source 16 feeds the developer to the cleaning liquid supplying nozzle 13, and the cleaning liquid supplying nozzle 13 supplies the developer to the backside of the substrate W. In this manner, in the present modification, the developer supplying source 16 supplies the developer to the developer supplying nozzle 11 and the cleaning liquid supplying nozzle 13. That is, the developer supplying source 16 also serves as the cleaning liquid supplying source. Consequently, the cleaning liquid supplying source 24 can be omitted, achieving a simplified configuration of the negative developing apparatus.

(12) The present embodiments and the modifications in the above (1) to (11) may be variable appropriately by replacing or combining the unit of the present embodiments or the modifications with the other thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A negative developing method for performing negative development to a substrate, the negative developing method comprising:
    a puddle-forming step of supplying developer containing an organic solvent to a resist film formed on a surface of the substrate, and keeping a puddle of the developer on the resist film;
    a diluting step of diluting a concentration of a dissolution product dissolved in the developer on the resist film by additionally supplying the developer containing the organic solvent to the resist film after the puddle-forming step; and
    a surface drying step of drying the surface of the substrate by rotating the substrate after the diluting step, wherein
    a rotation speed of the substrate in the diluting step is lower than a rotation speed of the substrate when the developer is supplied to the resist film in the puddle-forming step,
    the rotation speed of the substrate in the diluting step is lower than a rotation speed of the substrate in the surface drying step,
    a nozzle for supplying the developer containing the organic solvent in the diluting step is equal to a nozzle having been used for supplying the developer containing the organic solvent in the puddle-forming step,
    the nozzle does not move in a stand-by state above the substrate after the developer is supplied in the puddle-forming step until the diluting step starts, and
    the nozzle, in a plan view, overlaps the substrate after the developer is supplied in the puddle-forming step until the diluting step starts.

2. The negative developing method according to claim 1, wherein
    the developer containing the organic solvent is successively supplied in the diluting step.

3. The negative developing method according to claim 1, wherein
    the developer containing the organic solvent is intermittently supplied in the diluting step.

4. The negative developing method according to claim 3, wherein, in the diluting step,
    the substrate does not rotate during supply of the developer, and
    the substrate rotates while the supply of the developer stops.

5. The negative developing method according to claim 1, wherein
    the developer containing the organic solvent is supplied to the center of the substrate in the diluting step.

6. The negative developing method according to claim 1, wherein
    in the surface drying step, the substrate rotates while no cleaning liquid is supplied to the substrate for removing off the developer on the resist film by a centrifugal force.

7. The negative developing method according to claim 1, wherein
    the nozzle is disposed above the center of the substrate after the developer is supplied in the puddle-forming step until the diluting step starts.

8. A negative developing apparatus for performing negative development to a substrate, the negative developing apparatus comprising:
    a substrate holder that holds a substrate substantially horizontally;
    a rotating drive unit that rotates the substrate holder around a substantially vertical axis;
    a developer supplying unit that supplies developer containing an organic solvent to a surface of the substrate held with the substrate holder; and
    a controller that controls the rotating drive unit and the developer supplying unit, wherein
    the controller causes the developer supplying unit to supply the developer to a resist film formed on the surface of the substrate for forming a liquid layer of the developer on the resist film, causes the developer supplying unit to supply the developer to the resist film again for diluting a concentration of a dissolution product dissolved into the liquid layer of the developer on the resist film after the liquid layer of the developer remains on the resist film for a given period of time, and causes the rotating drive unit to rotate the substrate for drying the surface of the substrate,
    a rotation speed of the substrate when the concentration of the dissolution product is diluted being lower than a rotation speed of the substrate when the developer is supplied to the resist film for forming the liquid layer of the developer on the resist film, the rotation speed of the substrate when the concentration of the dissolution product is diluted being lower than a rotation speed of the substrate when the surface of the substrate is dried the developer supplying unit does not move in a stand-by state above the substrate after the developer supplying unit supplies the developer to the resist film for forming the liquid layer of the developer until the developer supplying unit supplies the developer to the resist film again for diluting the concentration of the dissolution product, and the developer supplying unit, in a plan view, overlaps the substrate after the developer supplying unit supplies the developer to the resist film for forming the liquid layer of the developer until the developer supplying unit supplies the developer to the resist film again for diluting the concentration of the dissolution product.

9. The negative developing apparatus according to claim 8, wherein
the controller causes successive supply of the developer containing the organic solvent when the concentration of the dissolution product is diluted.

10. The negative developing apparatus according to claim 8, wherein
the controller causes intermittent supply of the developer containing the organic solvent when the concentration of the dissolution product is diluted.

11. The negative developing apparatus according to claim 10, wherein
the substrate does not rotate during supply of the developer for a period of diluting the concentration of the dissolution product, and
the substrate rotates while the supply of the developer stops for the period of diluting the concentration of the dissolution product.

12. The negative developing apparatus according to claim 8, wherein
the controller causes supply of the developer containing the organic solvent to the center of the substrate when the concentration of the dissolution product is diluted.

13. The negative developing apparatus according to claim 8, wherein
the controller causes the substrate to rotate without supplying any cleaning liquid to the substrate for removing off the developer on the resist film by a centrifugal force when the surface of the substrate is dried.

14. The negative developing method according to claim 1, wherein
a period of the diluting step is shorter than a period of the puddle-forming step.

15. The negative developing method according to claim 1, wherein
a period of the diluting step is shorter than a period in which the developer is supplied to the resist film in the puddle-forming step.

16. The negative developing apparatus according to claim 8, wherein
a period of diluting the concentration of the dissolution product is shorter than a period in which the developer is supplied to the resist film for forming the liquid layer of the developer and the liquid layer of the developer is remained on the resist film for the given period of time.

17. The negative developing apparatus according to claim 8, wherein
a period of diluting the concentration of the dissolution product is shorter than a period in which the developer is supplied to the resist film for forming the liquid layer of the developer.

18. The negative developing apparatus according to claim 8, wherein
the developer supplying unit is disposed above the center of the substrate after the developer supplying unit supplies the developer to the resist film for forming the liquid layer of the developer until the developer supplying unit supplies the developer to the resist film again for diluting the concentration of the dissolution product.

* * * * *